United States Patent [19]

Bravo et al.

[11] Patent Number: 5,176,771
[45] Date of Patent: Jan. 5, 1993

[54] MULTILAYER CERAMIC TAPE SUBSTRATE HAVING CAVITIES FORMED IN THE UPPER LAYER THEREOF AND METHOD OF FABRICATING THE SAME BY PRINTING AND DELAMINATION

[75] Inventors: Pedro L. Bravo, Altadena; Roman Klyachman, Mission Viejo, both of Calif.

[73] Assignee: Hughes Aircraft Company, Los Angeles, Calif.

[21] Appl. No.: 811,730

[22] Filed: Dec. 23, 1991

[51] Int. Cl.$^5$ .............................................. B32B 31/00
[52] U.S. Cl. .................................... 156/85; 156/84; 156/89; 156/344; 156/247; 427/376.2; 427/287
[58] Field of Search ................... 427/376.2, 287; 156/344, 89, 85, 84, 247

[56] References Cited

U.S. PATENT DOCUMENTS

| | | | |
|---|---|---|---|
| 2,357,399 | 9/1944 | Gregory | 427/376.2 X |
| 2,587,152 | 2/1952 | Harlan | 427/376.2 |
| 2,728,158 | 12/1955 | Each | 427/376.2 X |
| 2,832,695 | 4/1958 | Compton | 427/376.2 X |
| 3,622,384 | 11/1971 | Davey | 427/376.2 X |
| 4,202,916 | 5/1980 | Chadda | 427/376.2 X |

OTHER PUBLICATIONS

Development of a Low Temperature Cofired Multilayer Ceramic Technology, William Vitriol et al., ISHM Proceedings 1983, pp. 593-598.

The Use of Low-Temperature, Cofired Ceramic Technology for the Fabrication of High-Density, Hermetic, Multicavity Modules, C. Sabo et al., Journal of the America Ceramic Society, Ceramic Substrates and Packages for Electronic Applications, Advances in Ceramics, vol. 26, 1988, pp. 217-228.

*Primary Examiner*—David A. Simmons
*Assistant Examiner*—M. De Simone
*Attorney, Agent, or Firm*—Terje Gudmestad; W. K. Denson-Low

[57] ABSTRACT

A plurality of sheets (12,16,18) of Low-Temperature-Cofired-Ceramic (LTCC) tape or other fusible ceramic tape are laminated together. A pattern (10) is printed on an external surface (12a) of the laminated structure (20) of a material having a thermal shrinkage rate which is different from that of the tape. The pattern (10) may be printed before or after lamination. The structure (20) is then baked to burn organic materials out of the tape. During this step, the pattern (10) and underlying portions (12b,12c) of the upper tape sheet (12) shrink to a different extent than the bulk of the structure (20), and delaminate therefrom to form cavities (26,28) having the same shape as the pattern (10). The structure (20) is then fired to sinter the tape and form a fused multilayer substrate (32). The cavities (26,28) may be filled with an electrically conductive or resistive material (36,38). Conductor traces (76,82;78,84) which are considerably thickner than can be fabricated using conventional thick film technology may be formed by filling cavities (72,74) with conductive material (76,78), and printing more conductive material (82,84) over the material (76,78) in the cavities (72,74). Alternatively, cavities (94,96) may be filled with an adhesive (98,100) for bonding a component such as a cover lid (104) to a multilayer substrate (92).

22 Claims, 2 Drawing Sheets

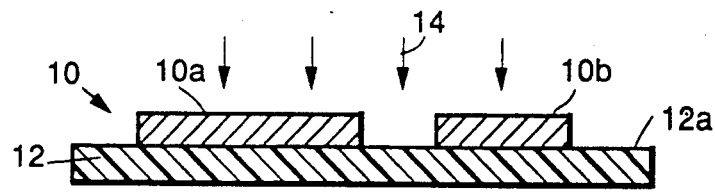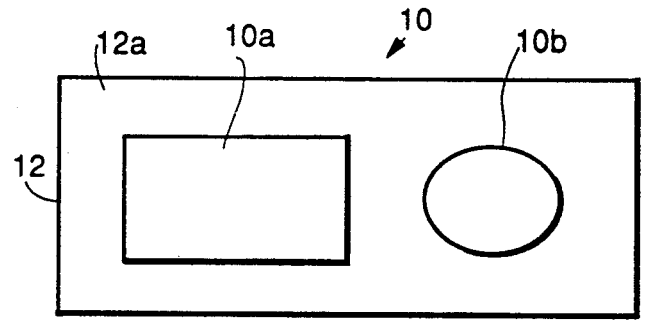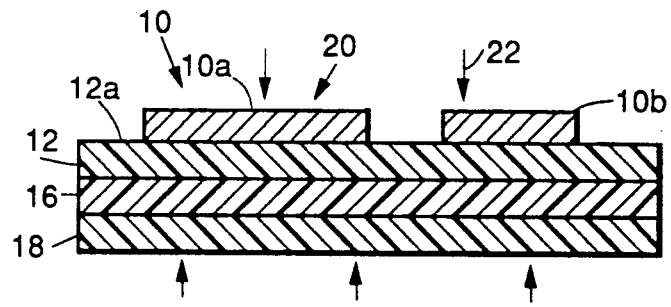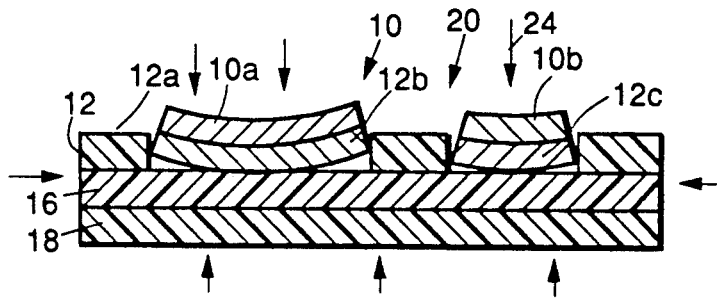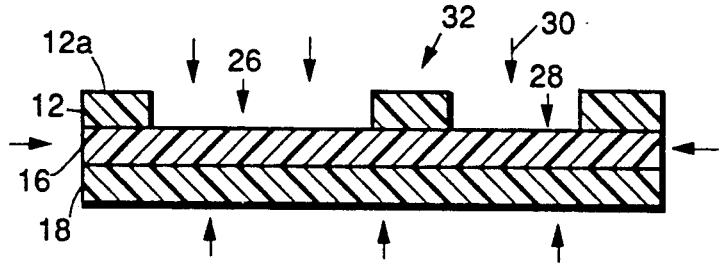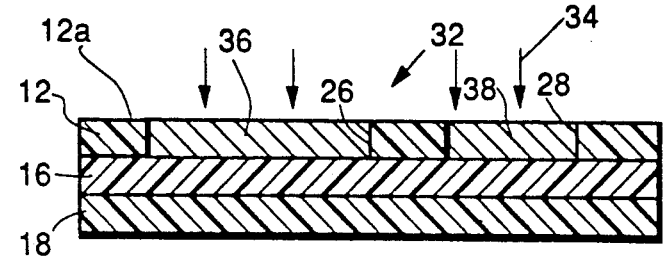

MULTILAYER CERAMIC TAPE SUBSTRATE HAVING CAVITIES FORMED IN THE UPPER LAYER THEREOF AND METHOD OF FABRICATING THE SAME BY PRINTING AND DELAMINATION

BACKGROUND OF THE INVENTION

1. Field of the Invention

The present invention generally relates to the art of microelectronics, and more specifically to the fabrication of a multilayer substrate including a plurality of laminated layers of ceramic tape, and cavities formed in an external surface of the substrate.

2. Description of the Related Art

Multilayer substrates for hybrid microcircuits may be advantageously fabricated using a low temperature cofired ceramic process such as described in an article entitled "DEVELOPMENT OF A LOW TEMPERATURE COFIRED MULTILAYER CERAMIC TECHNOLOGY", by William Vitriol et al, ISHM Proceedings 1983, pp. 593–598. This technology utilizes dielectric sheets in the form of Low-Temperature-Cofired-Ceramic (LTCC) tape.

The LTCC tape sheets may be metallized to make a ground plane, signal plane, bonding plane, or the like, or formed with via holes and back filled with metallization to form interconnect layers. Individual sheets of tape are then stacked on each other, laminated together using a predetermined temperature and pressure, and then fired at a desired elevated temperature at which the material fuses or sinters.

A preferred LTCC, which is known in the art as "green tape", is commercially available from the DuPont Company under the product designation #851AT. The tape contains a material formulation which can be a mixture of glass and ceramic fillers which sinter at about 850° C., and exhibits thermal expansion similar to alumina. The low-temperature processing permits the use of air fired resistors and precious metal thick film conductors such as gold, silver, or their alloys.

It is further desirable to form cavities in the upper external surface of the substrate to accommodate circuit components including chip capacitors and resistors, integrated circuits (ICs), diodes, transistors and voltage regulators, as described in an article entitled "The Use of Low-Temperature, Cofired Ceramic Technology for the Fabrication of High-Density, Hermetic, Multicavity Modules", by C. Sabo et al, in the Journal of the American Ceramic Society, Ceramic Substrates and Packages for Electronic Applications, Advances in Ceramics, Vol. 26, 1988, pp. 217–228. These cavities are conventionally formed using a computer-controlled punch. However, mechanical cavity punching is time consuming, wears the tools out quickly and is limited to regular shapes.

Conductive traces are conventionally formed on the external surfaces of multilayer LTCC substrates by thick film printing. However, the fired thickness of these traces is limited to approximately 10–15 micrometers using current technology, which provides insufficient electrical current and thermal conduction in some applications.

SUMMARY OF THE INVENTION

In accordance with the present invention, a plurality of sheets of LTCC tape or other fusible tape are laminated together. A pattern is printed on an external surface of the laminated structure of a material having a thermal shrinkage rate which is higher than that of the tape. The pattern may be printed before or after lamination.

The structure is baked at approximately 450° C. to burn organic materials out of the tape. During this step, the pattern and underlying portion of the upper tape sheet shrink more than the bulk of the structure, and delaminate therefrom to form a cavity having the same shape as the pattern. The structure is then fired at approximately 850° C. to sinter the tape and form a fused multilayer substrate.

It is further within the scope of the invention to provide a pattern which has a lower, rather than a higher thermal shrinkage rate than the bulk of the structure. It is only necessary that the thermal shrinkage rates be sufficiently different that the pattern and underlying portions of the sheet will delaminate from the structure during the heating step.

The cavity may be filled with an electrically conductive or resistive material. A conductor trace which is considerably thicker than can be fabricated using conventional thick film technology may be formed by filling the cavity with conductive material, and printing more conductive material over the material in the cavity. Alternatively, the cavity may be filled with an adhesive for bonding a component such as a cover lid to the substrate.

The present method and substrates fabricated thereby enable differentiated distribution of local trace resistivity and conductivity and electrical current flow to surface mounted components which cannot be achieved by conventional thick film printing methods. This increases the design capabilities of LTCC circuits.

The invention also provides additional capabilities for attachment of local jumper wires, cover lids, and local shields using polymerizing conductive or non-conductive materials. The push-off forces of cover lids can be increased considerably over conventional LTCC technology. In addition, solder and wire reworkability is enhanced by providing additional conductor traces or metallizations for attachment.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is a simplified sectional view illustrating a first step of a method of fabricating a multilayer substrate having cavities formed in an external surface thereof according to the present invention;

FIG. 2 is a plan view illustrating the result of the step of FIG. 1;

FIGS. 3 to 6 are simplified sectional views illustrating subsequent steps of the present method;

DETAILED DESCRIPTION OF THE INVENTION

Figure 7:
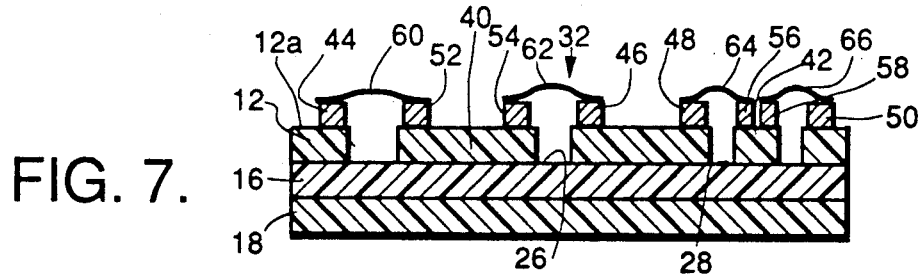
FIG. 7 is a simplified sectional view illustrating further steps of mounting a component in a cavity formed by the present method.

Referring to FIGS. 1 and 2 of the drawing, a material pattern 10 including exemplary rectangular and oval shaped sections 10a and 10b respectively is on a surface 12a of a fusible tape sheet 12 by, for thick film screen printing as indicated by 14. The sheet 12 may be glass-ceramic LTCC tape as described above, or any other applicable type of fusible tape such as ceramic transfer tape (TTRAN) as disclosed in U.S. Pat. No. 4,645,552, issued Feb. 24, 1987, entitled "PROCESS FOR FABRICATING DIMENSIONALLY STABLE. INTERCONNECT BOARDS", to William Vitriol et al.

The step of FIGS. 1 and 2 includes depositing the pattern 10 on the surface 12a in fluid (paste or liquid) form, and heating the sheet 12 to a temperature on the order of 80° C. for 10 minutes to dry and solidify the pattern 10. The material of the pattern 10 is selected to have a high degree of adherence to the sheet 12, and a thermal shrinkage rate which is higher than that of the sheet 12. In other words, the pattern 10 shrinks more than the sheet 12 when heated to a predetermined temperature.

Where the sheet 12 is LTCC green tape, the pattern 10 may be formed of a thick film printing paste or ink including a metal such as silver, platinum or palladium. Examples of inks which are suitable for practicing the present invention in combination with DuPont #851AT LTCC tape include Ferro FX-33-094 Silver Ink, Ferro FX-33-106 Silver Ink, Matsushita TC-17 Platinum Silver Ink, Quantum GAX122 Silver Ink and Eanco C350-1 Palladium Silver Ink.

As illustrated in FIG. 3, the sheet 12 is laminated together with additional fusible tape sheets 16 and 18 to form a laminated structure 20, with the surface 12a facing externally. The lamination is typically performed at a pressure of 3,000 psi and temperature of 80° C. as indicated by arrows 22.

In the next step of the method as illustrated in FIG. 4, the structure 20 is baked, typically at 450° C. for two hours as indicated by arrows 24, to burn out the organic materials from the sheets 12, 16 and 18. The elevated temperature causes the sheets 12, 16 and 18 to shrink by approximately 10 to 15%. However, the pattern 10 has a higher thermal shrinkage rate than the sheets 12, 16 and 18, and thereby shrinks to a larger extent. Since the pattern 10 is adhered to the 12a surface of the sheet 12, portions 12b and 12c of the sheet 12 underlying the pattern 10, or to which the pattern 10 is adhered, are restrained thereby from shrinking to the same extent as the bulk of the sheets 12, 16 and 18.

The difference in shrinkage causes the pattern 10 and portions 12b and 12c of the sheet 12 to delaminate and separate from the sheet 12 and thereby the bulk of the structure 20. This leaves cavities 26 and 28 in the external surface 12a of the structure 20 as illustrated in FIG. 5. The structure 20 is then fired at a temperature on the order of 830° C. for 10 minutes as indicated by arrows 30 to sinter or fuse the sheets 12, 16 and 18 and produce a multilayer substrate 32.

It is further within the scope of the invention to provide a pattern which has a lower, rather than a higher thermal shrinkage rate than the bulk o the structure. It is only necessary that the thermal shrinkage rates be sufficiently different that the pattern and underlying portions of the sheet will delaminate from the structure during the heating step.

The cavities 26 and 28 as formed by the present method may be at least partially filled with an electrically conductive, resistive or insulative material which adheres therein as illustrated in FIG. 6. This preferably accomplished using thick film screen printing, in which a conventional paste or ink having the desired electrical resistance is printed into the cavities 26 and 28 and heated as indicated by arrows 34 to produce recessed material sections 36 and 38.

Alternatively, electrical components 40 and 42 such as chip capacitors and resistors, integrated circuits (Ics), diodes, transistors or voltage regulators may be adhered to the substrate 32 inside the cavities 26 and 28 respectively. An electrically conductive metallization pattern including sections 44, 46, 48 and 50 is printed on the surface 12a of the substrate 32 and interconnected with electrical connection pads 52, 54, 56 and 58 on the components 40 and 42 by wire bonds 60, 62, 64 and 66 respectively. An exemplary alternative to wire bonding, although not specifically illustrated, is tape automated bonding (TAB).

Figure 8:
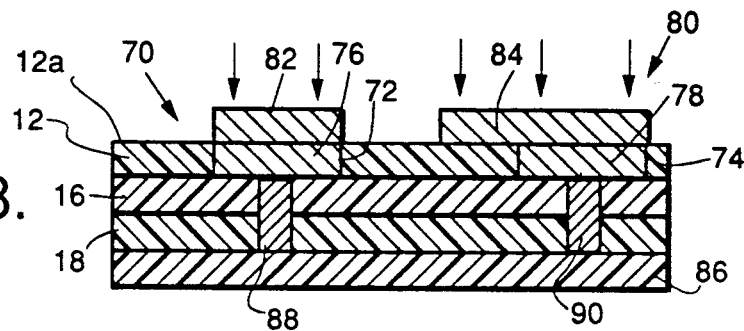
FIG. 8 is a simplified sectional view illustrating the fabrication of an electrical conductor pattern in accordance with the invention.

FIG. 8 illustrates how the present method can be used to fabricate a multilayer substrate 70 with thick electrically conductive traces, wherein like elements are designated by the same reference numerals used in FIGS. 1 to 6. The substrate 70 includes cavities 72 and 74 which, although not visible in the drawing, are elongated perpendicular to the plane of the figure for interconnection to hybrid microcircuit components (not shown). The cavities 72 and 74 are filled with an electrically conductive material such as silver, gold, platinum, palladium, copper or alloys thereof by thick film printing as described with reference to FIG. 6 to form recessed traces 76 and 78 respectively.

As indicated by arrows 80 in FIG. 8, additional electrically conductive traces 82 and 84 are then printed on the surface 12a of the substrate 70 such that at least portions thereof overlap and electrically contact the buried traces 76 and 78 respectively. The combined thickness of the traces 76,82 and 78,84 is considerably greater than can be provided by conventional thick film printing alone. Further illustrated in FIG. 8 are an electrically conductive ground plane 86, and electrically conductive vertical interconnects (vias) 88 and 90 which interconnect the traces 76 and 78 respectively with the ground plane 86.

The increased thickness of the traces 76,82 and 78,84 enables greater electrical and therma conduction therethrough, so that higher power components can be accommodated on the substrate 70. Depending on the particular application, the present arrangement also enables differentiated distribution of local trace resistivity and conductivity and electrical current flow to surface mounted components. This also increases the design capabilities of LTCC circuits, including additional capabilities for attachment of local jumper wires and local shields.

Figure 9:
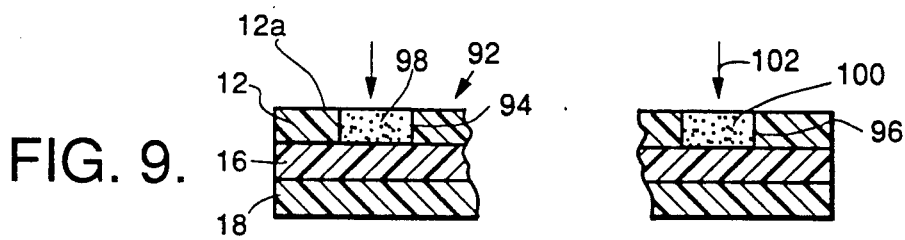
FIGS. 9 and 10 are simplified sectional views illustrating the adhesive mounting of a cover lid in accordance with the invention.
Figure 10:
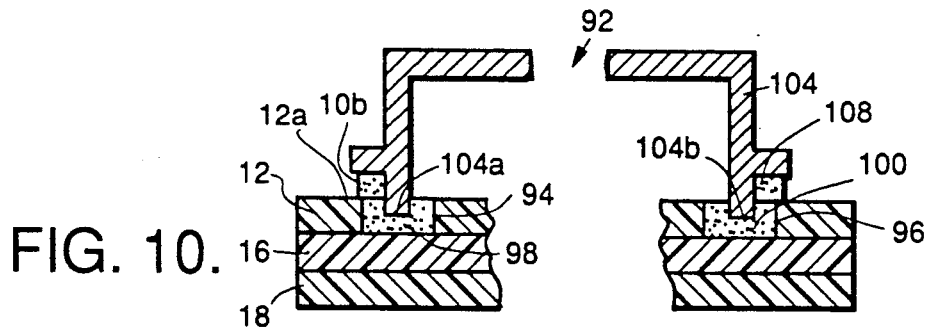

FIGS. 9 and 10 illustrate a substrate 92 formed with cavities 94 and 96 which are filled with an adhesive material as indicated at 98 and 100 respectively. The adhesive may be a thermoplastic or thermosetting polymer resin, or any other of suitable type of adhesive. Arrows 102 indicate the adhesive 98 and 100 as being deposited into the cavities 94 and 96 in fluid form.

As viewed in FIG. 10, a component such as a cover lid 104 is mounted on the substrate 92 such that lower edges 104a and 104b thereof enter the cavities 94 and 96 and contact the adhesive 98 and 100 therein respectively. Additional adhesive 106 and 108 may be applied between the lower edges 104a and 104b of the lid 104 and the surface 12a of the substrate 92 for increased adhesion.

The adhesive 98, 100, 106 and 108 is allowed to cure with or without the application of heat to bond the lid 104 to the substrate 92. The cavities 94 and 96 increase the amount of adhesive which can be applied and thereby the bonding force. This produces a considerable increase in the push-off force of the lid 104.

Figure 11:
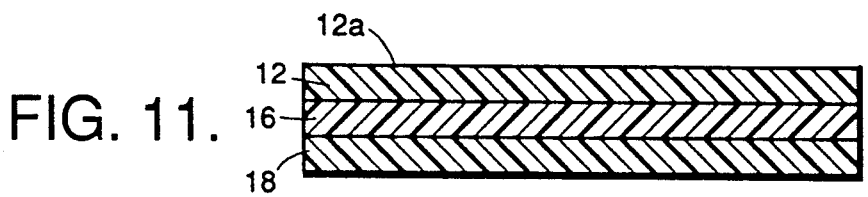
FIGS. 11 and 12 are simplified sectional views illustrating alternative steps for practicing the present method.
Figure 12:
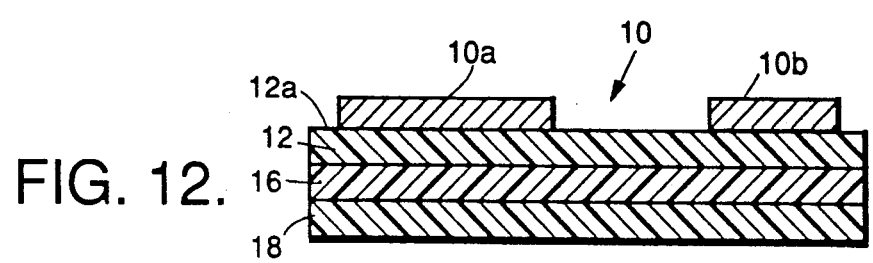

Whereas the pattern 10 is formed on the sheet 12 prior to lamination of the sheet 12 to the sheets 16 and 18 in the embodiment of the invention illustrated in FIGS. 1 to 5, this order can be reversed as shown in FIGS. 11 and 12. In FIG. 11, the sheets 12, 16 and 18 are laminated together. In FIG. 12, the pattern 10 is formed on the external surface 12a of the sheet 12 to produce a structure which is essentially similar to that illustrated in FIG. 3. The structure of FIG. 12 is subsequently subjected to the processing steps of FIGS. 4 and 5 to produce a fused multilayer substrate as shown in FIG. 5.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method of fabricating a multilayer microelectronic substrate, comprising the steps of:
   (a) providing a plurality of thermally fusible sheets having a first thermal shrinkage rate;
   (b) adhering a material pattern having a predetermined shape and a second thermal shrinkage rate which is different from said first rate on a surface of one of said sheets;
   (c) laminating said sheets together such that said surface faces externally; and
   (d) heating said laminated sheets at a predetermined temperature at which said pattern and the portion of the sheet to which said pattern is adhered shrink to a different extent than the bulk of said laminated sheets and delaminate therefrom to form a cavity having said shape in said surface, and said bulk fuses to form said substrate.

2. A method as in claim in which step (a) comprises providing said sheets in the form of ceramic tape sheets.

3. A method as in claim 1, in which step (a) comprises providing said sheets in the form of glass-ceramic tape sheets.

4. A method as in claim 1, in which step (b) is performed before step (c).

5. A method as in claim 1, in which step (b) is performed after step (c).

6. A method as in claim 1, in which step (b) comprises thick film printing.

7. A method as in claim 6, in which step (b) comprises forming said pattern of electrically conductive ink.

8. A method as in claim 7, in which step (b) comprises providing said ink as including a material selected from the group consisting of silver, platinum and palladium.

9. A method as in claim 1, further comprising the step, performed after step (d), of:
   (e) adhering a solid, electrically conductive material inside said cavity.

10. A method as in claim 9, in which step (e) comprises the substeps of:
    (f) depositing said conductive material inside said cavity in fluid form; and
    (g) heating said substrate to solidify said conductive material.

11. A method as in claim 10, in which step (f) comprises thick film printing.

12. A method as in claim 11, in which step (f) comprises providing said conductive material in the form of electrically conductive paste.

13. A method as in claim 1, further comprising the step, performed after step (d), of:
    (e) adhering a solid, electrically resistive material inside said cavity.

14. A method as in claim 13, in which step (e) comprises the substeps of:
    (f) depositing said resistive material inside said cavity in fluid form; and
    (g) heating said substrate to solidify said resistive material.

15. A method as in claim 14, in which step (f) comprises thick film printing.

16. A method as in claim 15, in which step (f) comprises providing said resistive material in the form of electrically resistive paste.

17. A method as in claim 1, further comprising the steps, performed after step (d), of:
    (e) depositing an adhesive material inside said cavity in fluid form;
    (f) holding a component in contact with said adhesive material; and
    (g) curing said adhesive material to bond the component to said substrate.

18. A method as in claim 1, further comprising the step, performed after step (d), of:
    (e) adhering an electrical component inside said cavity.

19. A method as in claim 18, further comprising the steps of:
    (f) adhering an electrically conductive contact to said surface; and
    (g) after performing step (e), electrically interconnecting said component and said contact.

20. A method as in claim 19, in which step (g) comprises wire bonding.

21. A method as in claim 1, further comprising the steps, performed after step (d), of:
    (e) adhering a solid, electrically conductive material inside said cavity; and
    (f) adhering an electrically conductive contact to said surface, at least a portion of said contact overlying at least a portion of said conductive material in electrical connection therewith.

22. A method of forming a cavity in a surface of a laminated ceramic tape substrate, comprising the steps of:
    (a) adhering a material pattern to said surface, said material having a thermal shrinkage rate which is different from the thermal shrinkage rate of said ceramic tape; and
    (b) heating said substrate such that said pattern and an underlying portion of said ceramic tape delaminates from said substrate to form said cavity.

* * * * *